United States Patent
Goryu et al.

(10) Patent No.: US 10,847,620 B2
(45) Date of Patent: Nov. 24, 2020

(54) SEMICONDUCTOR DEVICE AND METHOD OF MANUFACTURING THE SAME

(71) Applicant: KABUSHIKI KAISHA TOSHIBA, Tokyo (JP)

(72) Inventors: Akihiro Goryu, Kanagawa (JP); Mitsuaki Kato, Kanagawa (JP); Kenji Hirohata, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/118,065

(22) Filed: Aug. 30, 2018

(65) Prior Publication Data

US 2019/0221646 A1 Jul. 18, 2019

(30) Foreign Application Priority Data

Jan. 18, 2018 (JP) ................................. 2018-006732

(51) Int. Cl.
*H01L 21/3065* (2006.01)
*H01L 29/16* (2006.01)
(Continued)

(52) U.S. Cl.
CPC ........ *H01L 29/1608* (2013.01); *H01L 29/045* (2013.01); *H01L 29/41741* (2013.01);
(Continued)

(58) Field of Classification Search
None
See application file for complete search history.

(56) References Cited

U.S. PATENT DOCUMENTS 6,680,240 B1 1/2004 Maszara
9,064,780 B2 6/2015 Iijima et al.
(Continued)

FOREIGN PATENT DOCUMENTS

JP 2004-96034 A 3/2004
JP 2005-531144 A 10/2005
(Continued)

OTHER PUBLICATIONS

T. Mizuno, et al. "Carrier Mobility Enhancement in Advanced SOI-MOSFETs with Strained-Si Channel," Toshiba Review, vol. 56, No. 1, pp. 58-61 (2001).
(Continued)

*Primary Examiner* — Ali Naraghi
(74) *Attorney, Agent, or Firm* — Finnegan, Henderson, Farabow, Garrett & Dunner, L.L.P.

(57) ABSTRACT

A semiconductor device comprises a semiconductor chip and a mounting substrate. The semiconductor chip has an element structure including: a silicon carbide substrate that has a hexagonal crystal structure; a gate electrode that is disposed on a part above a first surface corresponding to a (0001) plane or a (000-1) plane of the silicon carbide substrate; an insulating film that is interposed between the silicon carbide substrate and the gate electrode; and a source and a drain that are disposed with respect to the silicon carbide substrate and the gate electrode such that at least a part of a channel through which a carrier moves extends in a <1-100> direction of crystal orientation of the silicon carbide substrate. The mounting substrate is fixed with the semiconductor chip such that compressive stress in a <11-20> direction of crystal orientation of the silicon carbide substrate is applied to the semiconductor chip at least in operation.

11 Claims, 9 Drawing Sheets

(51) Int. Cl.
*H01L 29/417* (2006.01)
*H01L 29/66* (2006.01)
*H01L 29/423* (2006.01)
*H01L 29/78* (2006.01)
*H01L 29/04* (2006.01)

(52) U.S. Cl.
CPC .. *H01L 29/42356* (2013.01); *H01L 29/66068* (2013.01); *H01L 29/78* (2013.01); *H01L 29/7827* (2013.01); *H01L 29/7842* (2013.01); *H01L 29/7849* (2013.01)

(56) References Cited

U.S. PATENT DOCUMENTS

| | | |
|---|---|---|
| 2005/0034996 A1 | 2/2005 | Horsthemke et al. |
| 2006/0199310 A1* | 9/2006 | Nakabayashi ...... H01L 21/8221 438/128 |
| 2007/0108526 A1 | 5/2007 | Kohyama |
| 2014/0191247 A1* | 7/2014 | Iijima ................. H01L 29/0657 257/77 |
| 2017/0162464 A1* | 6/2017 | Morino ............... H01L 23/3736 |

FOREIGN PATENT DOCUMENTS

| | | |
|---|---|---|
| JP | 2006-245408 A | 9/2006 |
| JP | 4879507 B2 | 10/2006 |
| JP | 2007-158322 A | 6/2007 |
| JP | 3987514 B2 | 10/2007 |
| JP | 5192661 B2 | 12/2007 |
| JP | 2016-62968 A | 4/2016 |
| JP | 6099981 B2 | 3/2017 |

OTHER PUBLICATIONS

A. Goryu et al., U.S. Appl. No. 15/911,550, filed Mar. 5, 2018.

* cited by examiner (a)

(b)

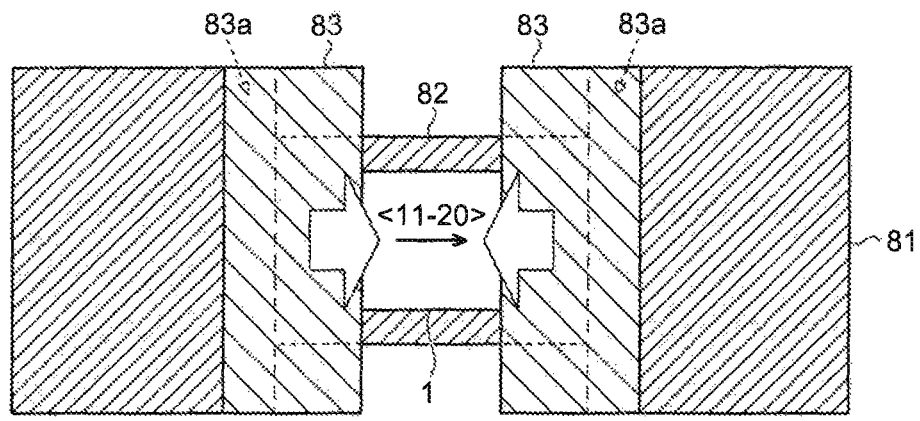
FIG.9A
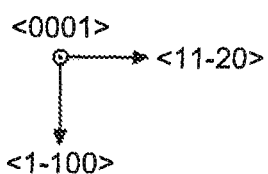
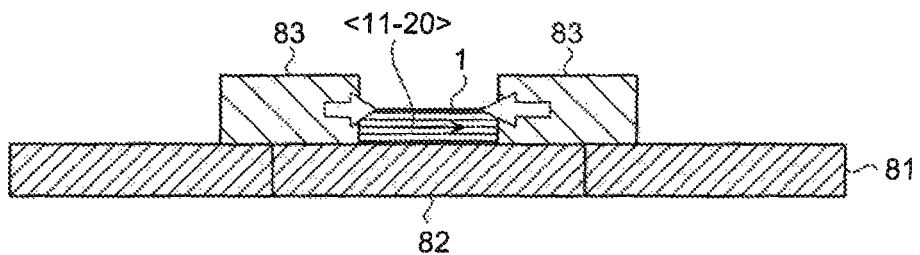
FIG.9B
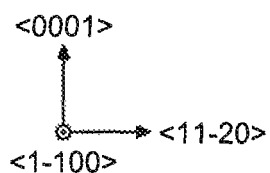

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2018-006732, filed on Jan. 18, 2018; the entire contents of which are incorporated herein by reference.

FIELD

Embodiments described herein relate generally to a semiconductor device and a method of manufacturing the same.

BACKGROUND

Silicon carbide (SiC) is a semiconductor material having ten times as large breakdown field strength as that of silicon (Si) and having material properties excellent in thermal conductivity, electron mobility, a band gap, and others. With these properties, silicon carbide is expected to be one of semiconductor materials that can markedly improve the performance compared to conventional Si-based power semiconductor elements.

A SiC-based power semiconductor element is general categorized in a unipolar semiconductor element in which either an electron or an electron hole relates to electrical conductivity when current passes and in a bipolar semiconductor element in which both an electron and an electron hole relate to electrical conductivity. The unipolar semiconductor element includes, for example, the schottky diode (SBD), the junction field effect transistor (J-FET), and the metal-oxide-semiconductor field-effect transistor (MOSFET). The bipolar semiconductor element includes, for example, a pn diode, a bipolar junction transistor (BJT), a thyristor, a gate turn-off thyristor (GTO thyristor), and an insulated gate bipolar transistor (IGBT). For example, refer to Japanese Patent No. 6099981, Japanese Patent Application Laid-open No. 2016-62968, Japanese Patent No. 3987514, and MIZUNO Tomohisa, SUGIYAMA Naoharu, and TAKAGI Shin-ichi, "Carrier Mobility Enhancement in Advanced SOI-MOSFETs with Strained-Si Channel", Toshiba Review Vol. 56(1) (2001).

BRIEF DESCRIPTION OF THE DRAWINGS

FIG. 9A and FIG. 9B are drawings that illustrate an exemplary mounting structure of a semiconductor device according to a fourth embodiment;

DETAILED DESCRIPTION

Semiconductor devices and methods of manufacturing the semiconductor devices according to exemplary embodiments will now be described in detail with reference to the accompanying drawings.

As described above, a power semiconductor element made of SiC as a semiconductor material has excellent properties in various fields, and studies about manufacturing, for example, a metal-oxide-semiconductor field-effect transistor (MOSFET) as a switching element using these properties are widely undertaken. In these studies, however, such a method is mainly employed that uses 4H—SiC as a substrate material and makes a MOSFET on the (0001) plane. Because this manner increases the interface state density present on the interface between the silicon dioxide thin film ($SiO_2$) and the SiC substrate, expected channel mobility is less likely to be obtained compared to a theoretical value.

On the other hand, a MOSFET (hereinafter referred to as a Si-MOSFET) made using Si as the semiconductor material can increase carrier mobility by applying strain to the channel region. A MOSFET (hereinafter referred to as a SiC-MOSFET) made using SiC as the semiconductor material is therefore expected to similarly increase carrier mobility by applying strain to the channel region.

With respect to 4H—SiC in a hexagonal crystal structure mainly used for a power semiconductor element, however, properties such as variation of carrier mobility to stress are not adequately evaluated. The most effective crystal axis to be strained for increasing performance characteristics is therefore unknown in conventional techniques.

From these points of view, the inventors of this application have conducted various studies and experimentally found that, in a 4H—SiC-MOSFET, application of compressive stress in the <11-20> and <1-100> directions change the current-voltage ($I_d$-$V_{ds}$) characteristics and reduce on-resistance. Particularly, applying compressive stress in the <11-20> direction has been found to achieve a large reduction rate of on-resistance compared to applying compressive stress in the <1-100> direction.

In the following embodiments, semiconductor devices with a 4H—SiC-MOSFET, the performance characteristics of which are improved by controlling a direction of stress applied to the semiconductor device at the device level or the mounting level, and methods of manufacturing the semiconductor devices are therefore described by giving examples.

First Embodiment

Figure 1:
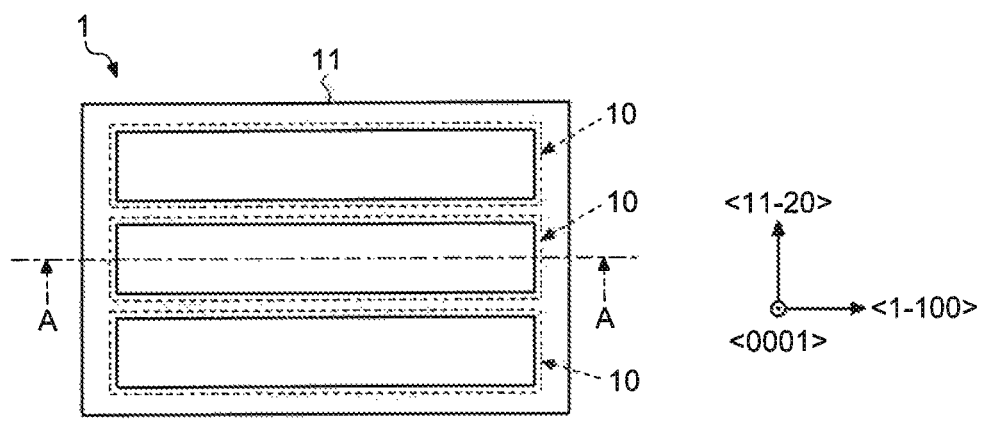
FIG. 1 is a top view of an exemplary schematic configuration of a semiconductor element according to a first embodiment.
Figure 2:
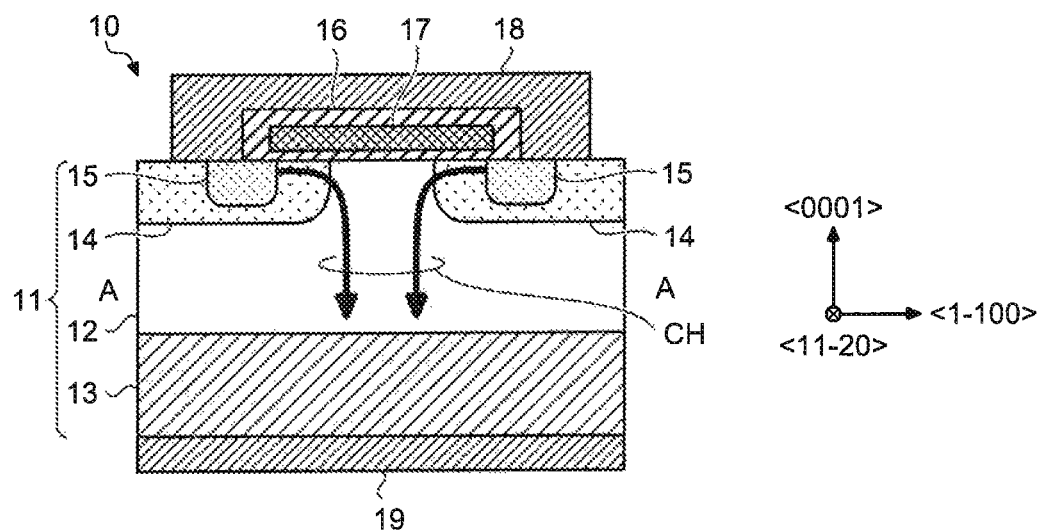
FIG. 2 is a sectional drawing that illustrates a sectional structure along line A-A in FIG. 1.

A semiconductor device and a method of manufacturing the same according to a first embodiment will now be described in detail with reference to the accompanying drawings. FIG. 1 is a top view of an exemplary schematic configuration of a semiconductor element according to this embodiment, and FIG. 2 is a sectional drawing that illustrates a sectional structure along line A-A in FIG. 1. Plane A-A in FIG. 1 and in FIG. 2 is a surface parallel to the (11-20) plane. FIG. 1 illustrates an exemplary semiconductor chip 1 in which three semiconductor elements 10 are aligned in the <11-20> direction on a separated SiC monocrystal substrate (hereinafter referred to as a SiC substrate) 11. The semiconductor chip 1 according to this embodiment is not limited to this configuration, and the configuration can be modified in various manners if the configuration has one or more semiconductor elements 10 formed on the SiC substrate 11.

As illustrated in FIG. 1 and FIG. 2, an individual semiconductor element 10 has an element structure of a vertical 4H—SiC-MOSFET (hereinafter, referred to as a vertical MOSFET) including the SiC substrate 11, a gate electrode 17, a source electrode 18, a gate insulating film 16, and a drain electrode 19.

In the element structure illustrated in FIG. 1 and FIG. 2, the gate electrode 17 is disposed on a part above the (0001) plane corresponding to the upper surface of the SiC substrate 11. The source electrode 18 is disposed in a manner contacting contact layers 15 exposed on the (0001) plane of the SiC substrate 11 and covering the gate electrode 17 on the (0001) plane. In FIG. 2, the source electrode 18 contacts the SiC substrate 11 at two regions; however, the number of contact regions between the source electrode 18 and the SiC substrate 11 is not limited to two and can be changed to one, three, or more. The gate insulating film 16 is interposed between the SiC substrate 11 and the gate electrode 17 and between the gate electrode 17 and the source electrode 18, thereby electrically isolating the gate electrode 17 from the SiC substrate 11 and the source electrode 18. The drain electrode 19 is disposed on the (000-1) plane corresponding to the bottom surface of the SiC substrate 11.

In the element structure illustrated in FIG. 2, the SiC substrate 11 is constituted by, for example, a first layer 12 on the (0001) plane side and a second layer 13 on the (000-1) plane side. In this case, the second layer 13 has the concentration of dopant higher than that of the first layer 12. The first layer 12 having lower concentration functions as a drift layer in which a channel, through which carriers move, is formed. The layer structure is, however, not limited to this structure. For example, the first layer 12 out of the first layer 12 and the second layer 13 may be a SiC film (hereinafter referred to as a SiC epitaxial film) formed on the second layer 13 using, for example, the epitaxial growth. In this structure, the SiC substrate 11 partially includes the first layer 12 as an epitaxial film.

If the semiconductor element 10 is an n-type MOSFET, donors such as phosphorus (P) and arsenic (As) are spread in the first layer 12 and the second layer 13 as dopants. If the semiconductor element 10 is a p-type MOSFET, acceptors such as boron B and aluminum (Al) are spread in the first layer 12 and the second layer 13 as dopants.

Two well regions 14 are formed on the upper layer portions of the first layer 12 in a manner sandwiching a region under the gate electrode 17. A contact layer 15 is formed in a part of each well region 14 in a manner contacting the source electrode 18 and partially extending to an area under the gate electrode 17.

The well region 14 is a region where dopants for adjusting the threshold voltage of the semiconductor element 10 are spread. For example, the well regions 14 are doped with acceptors if the semiconductor element 10 is an n-type MOSFET and are doped with donors if the semiconductor element 10 is a p-type MOSFET.

The contact layer 15 is a region for forming a region electrically continuous with the source electrode 18 in the well region 14. The contact layers 15 are therefore doped with donors if the semiconductor element 10 is an n-type MOSFET and doped with acceptors if the semiconductor element 10 is a p-type MOSFET.

Various insulating films such as a silicon dioxide thin film (SiOx) and a silicon nitride thin film (SiNy) can be used for the gate insulating film 16 for electrically isolating the gate electrode 17 from the SiC substrate 11 and the source electrode 18.

The gate electrode 17, the source electrode 18, and the drain electrode 19 each may be polysilicon layers doped with a certain dopant or may be conductor layers formed of conductors such as metal and alloy metal.

Figure 3:
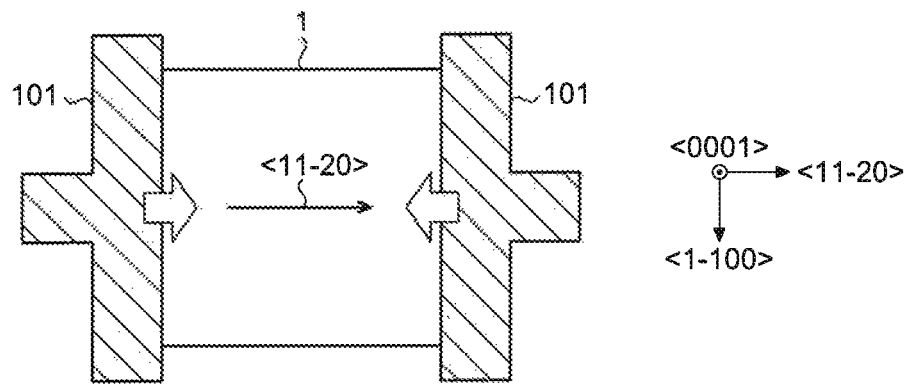
FIG. 3 is an illustrative drawing of stress applied to a semiconductor chip according to the first embodiment.

In the semiconductor element 10 having the above-described element structure, channels CH through which carriers move from the contact layers 15 to the drain electrode 19 passing through the respective well regions 14, the first layer 12, and the second layer 13 are formed in the well regions 14 and the first layer 12 under the gate electrode 17 by applying driving voltage to the gate electrode 17. In this configuration, for example, as illustrated in FIG. 3, applying compressive stress in the <11-20> direction changes the current-voltage characteristics of the SiC substrate 11 and reduces on-resistance in the <1-100> direction as described above and further reduces resistance (channel resistance) of the channel CH formed under the gate electrode 17.

In this embodiment, an exemplary configuration of a semiconductor device capable of applying compressive stress in the <11-20> direction to the semiconductor element 10 at the device level or the mounting level and a method of manufacturing the semiconductor device are therefore described. The configuration of sandwiching the semiconductor element 10 in the <11-20> direction using jigs 101 as illustrated in FIG. 3 is only an example of applying compressive stress in the <11-20> direction to the semiconductor element 10, and the embodiment is not limited to this configuration.

Applying compressive stress in the <1-100> direction also enables a reduction in on-resistance of the SiC substrate 11 and a reduction in the channel resistance; however, applying compressive stress in the <11-20> direction is more effective. Applying compressive stress in the <11-20> direction is therefore described in this embodiment.

Furthermore, the semiconductor element 10 according to this embodiment is not limited to a vertical MOSFET where a source and a drain are disposed in a lamination direction with respect to an element forming surface of a semiconductor substrate as illustrated in FIG. 2. In addition to this type, the semiconductor element 10 may be implemented by various types of semiconductor elements configured such that at least a part of a channel CH (also referred to as a current path) through which carriers move extends in the <1-100> direction of crystal orientation of the SiC substrate 11, such as a lateral 4H—SiC-MOSFET (hereinafter referred to as a lateral MOSFET) 20 where a source and a drain are laterally disposed along an element forming surface of a semiconductor substrate as illustrated in FIG. 4.

In this embodiment, the (0001) plane side of the SiC substrate 11 is defined as an element forming surface where a semiconductor element is formed. Instead of this configuration, the element forming surface may be the (000-1) plane opposite to the (0001) plane.

Figure 4:
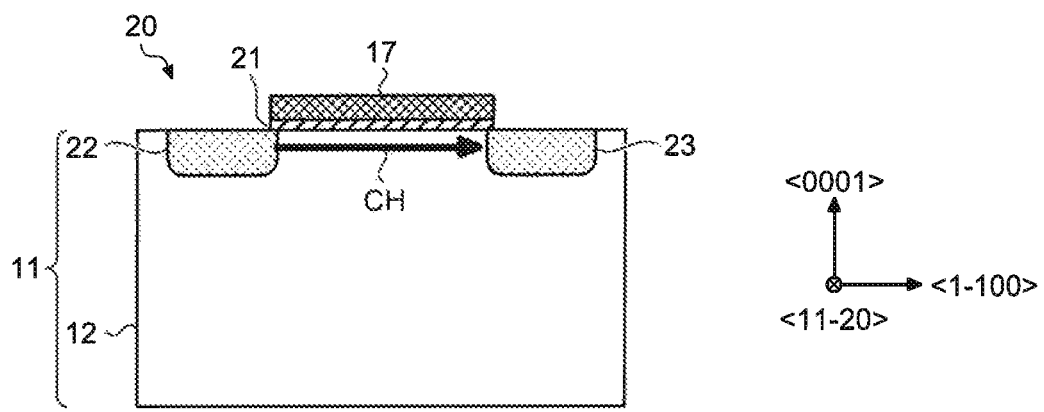
FIG. 4 is a top view of another exemplary schematic configuration of the semiconductor element according to the first embodiment.

In FIG. 4, a numeral 21 denotes a gate insulating film, a numeral 22 denotes a source region, and a numeral 23 denotes a drain region. As with the gate insulating film 16, the gate insulating film 21 is implemented by various insulating films such as a silicon dioxide thin film (SiOx) and a silicon nitride thin film (SiNy) and electrically isolates the gate electrode 17 from the SiC substrate 11. The source region 22 and the drain region 23 are connected with respective wiring layers (not illustrated).

In a semiconductor element 20 having the above-described element structure, a channel CH along the <1-100> direction of the SiC substrate 11 is formed in the first layer 12 under the gate electrode 17 by applying driving voltage to the gate electrode 17. As with the above-described FIG. 3, applying compressive stress in the <11-20> direction changes the current-voltage characteristics of the SiC substrate 11 and reduces on-resistance in the <1-100> direction and further reduces resistance (channel resistance) of the channel CH formed under the gate electrode 17.

Figure 5:
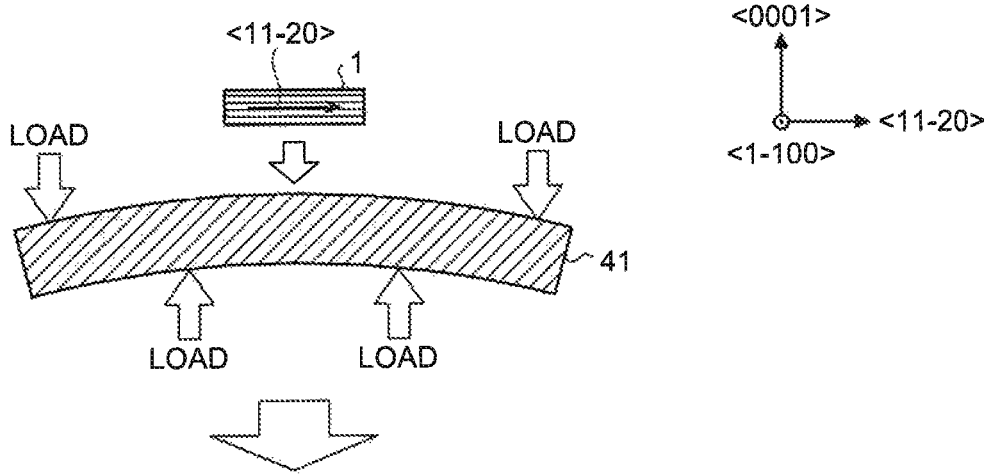
FIG. 5 is a schematic sectional drawing that illustrates a method of manufacturing a semiconductor device according to the first embodiment and a mounting state.
Figure 5:
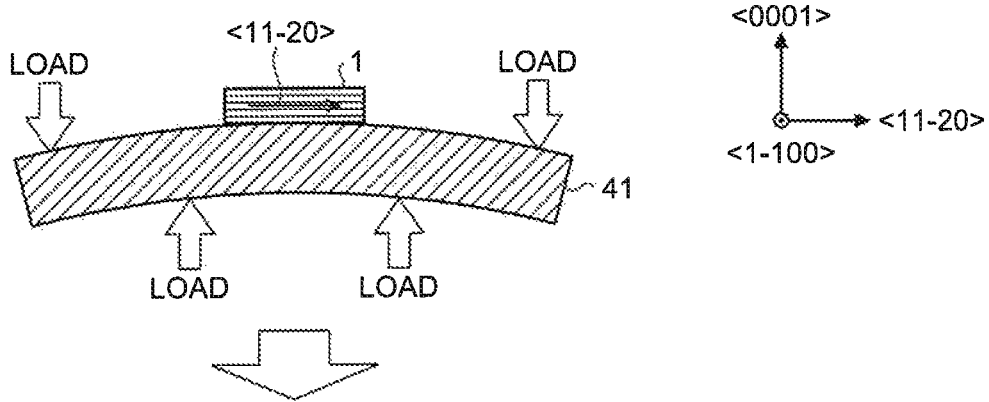
Figure 5:
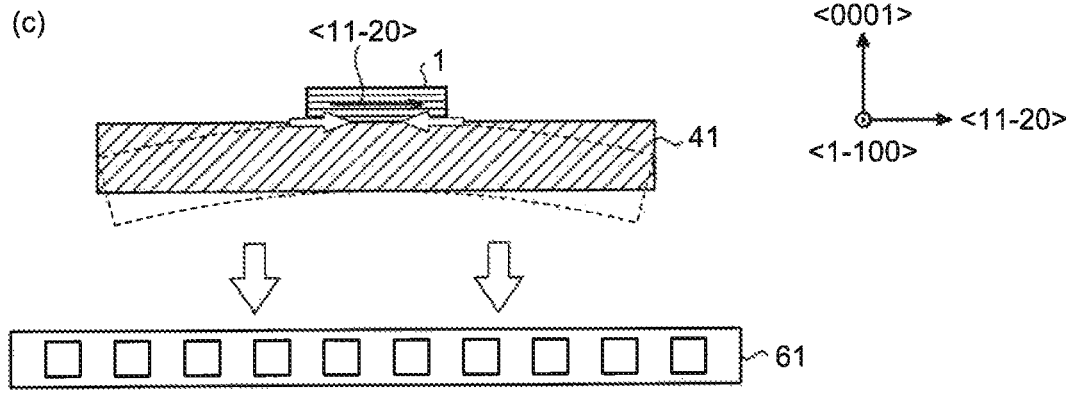

FIG. 5 is a schematic sectional drawing that illustrates a method of manufacturing a semiconductor device according to this embodiment and a mounting state (including in operation, and the same will apply to the following description). As illustrated in FIG. 5, in the semiconductor device according to this embodiment, the semiconductor chip 1 is mounted on a mounting substrate 41 such that compressive stress in the <11-20> direction is continuously applied to the semiconductor chip 1. More specifically, as illustrated in FIG. 5(a), a device mounting surface of the mounting substrate 41 is bent in a manner convexly curved by applying mechanical load to the mounting substrate 41 having the semiconductor chip 1 mounted thereon.

As illustrated in FIG. 5(b), the semiconductor chip 1 is fixed to the device mounting surface of the mounting substrate 41 with a plane including the convexly curved sectional surface (the illustrated sectional surface) of the mounting substrate 41 aligned with the (1-100) plane of crystal orientation of the SiC substrate 11 constituting the semiconductor chip 1. In this configuration, the semiconductor chip 1 is fixed to the device mounting surface, the area of which is increased by being convexly curved.

As illustrated in FIG. 5(c), the semiconductor chip 1 is fixed to a support substrate 61 together with the mounting substrate 41 with the mechanical load applied to the mounting substrate 41 released. Mechanical resilience, which is a move of the increased device mounting surface of the mounting substrate 41 shrinking to its initial area, continuously applies compressive stress in the <11-20> direction to the semiconductor chip 1 in an ordinary state (including in operation, which will apply to the following description) with the mounting substrate 41 unbent. This compressive stress changes the current-voltage characteristics of the SiC substrate 11 and reduces on-resistance in the <1-100> direction and, furthermore, reduces resistance of the channel CH formed under the gate electrode 17. The performance characteristics of the semiconductor element 10 are therefore improved.

In the example of FIG. 5, the semiconductor chip 1 is fixed, for example, face-up to the mounting substrate 41 with the surface opposite to an element forming surface of the semiconductor chip 1 facing the mounting substrate 41. Instead of this manner, the semiconductor chip 1 may be fixed face-down to the mounting substrate 41 with the element forming surface facing the mounting substrate 41. The support substrate 61 in FIG. 5 is not necessarily disposed and can be omitted.

In the above-described configuration of this embodiment, compressive stress in the <11-20> direction is continuously applied to the semiconductor chip 1 in the mounted state. This compressive stress changes the current-voltage characteristics of the SiC substrate 11 and reduces on-resistance in the <1-100> direction and, furthermore, reduces resistance of the channel CH formed under the gate electrode 17, which can improve performance characteristics of the semiconductor element 10.

Second Embodiment

Figure 6:
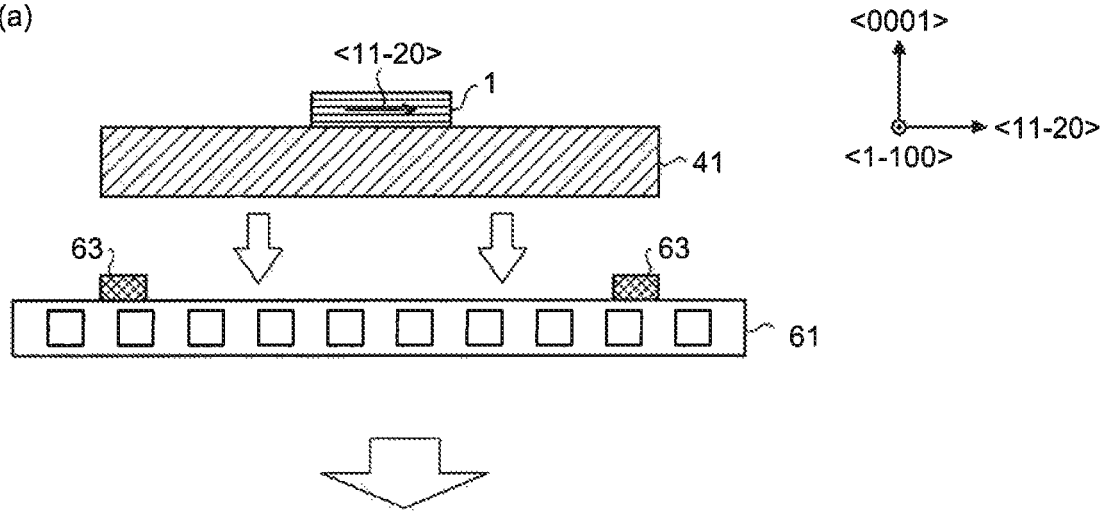
FIG. 6 is a schematic sectional drawing that illustrates a method of manufacturing a semiconductor device according to a second embodiment and a mounting state.
Figure 6:
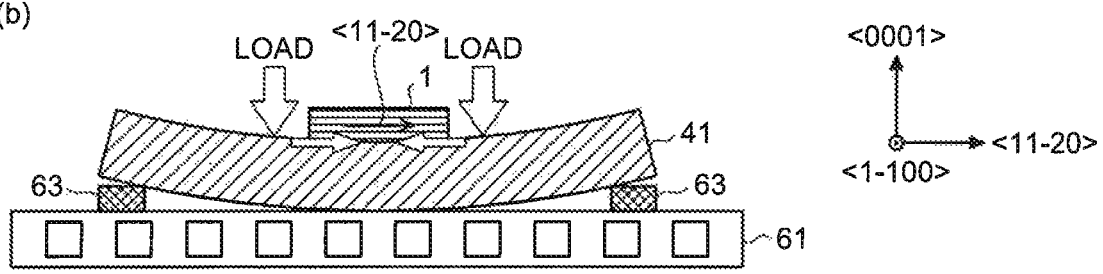

A semiconductor device and a method of manufacturing the same according to a second embodiment will now be described with reference to the accompanying drawings. In the exemplary configuration of the above-described first embodiment, compressive stress in the <11-20> direction is continuously applied to the semiconductor chip 1 using resilience against bending of the mounting substrate 41; however, this embodiment is not limited to this configuration. As illustrated in FIG. 6, such a configuration is also applicable that continuously applies compressive stress in the <11-20> direction to the semiconductor chip 1 by keeping the mounting substrate 41 having the semiconductor chip 1 mounted thereon bent in a use state (hereinafter referred to as an ordinary state).

FIG. 6 is a schematic sectional drawing that illustrates the method of manufacturing a semiconductor device according to the second embodiment and a mounting state and illustrate an exemplary configuration where compressive stress in the <11-20> direction is continuously applied to the semiconductor device with a mounting substrate fixed to a support substrate. In this example, the semiconductor chip 1 is mounted on an unbent mounting substrate 41 as illustrated in FIG. 6(a). The support substrate 61 to which the mounting substrate 41 is fixed has, for example, protrusions 63 in positions corresponding to respective ends of the mounting substrate 41.

The mounting substrate 41 is fixed to the support substrate 61. More specifically, the approximate center (for example, a back surface of a portion where the semiconductor chip 1 is mounted) of the mounting substrate 41 is fixed to the support substrate 61 as illustrated in FIG. 6(b). The protrusions 63 protruding from the mounting surface of the support substrate 61 support respective ends of the mounting substrate 41, which renders the mounting substrate 41 concavely curved. The concavely curved mounting substrate 41 is fixed to the support substrate 61 with a plane including the concavely curved sectional surface (the illustrated sectional surface) of the mounting substrate 41 aligned with the (1-100) plane of crystal orientation of the SiC substrate 11 constituting the semiconductor chip 1. This configuration allows compressive stress in the <11-20> direction to be continuously applied to the semiconductor chip 1. Consequently, as with the first embodiment, the compressive stress changes the current voltage characteristics of the SiC substrate 11 and reduces on-resistance in the <1-100> direction and, furthermore, reduces resistance of the channel CH formed under the gate electrode 17.

In the example of FIG. 6, the semiconductor chip 1 is fixed, for example, face-up to the mounting substrate 41. Instead of this manner, the semiconductor chip 1 may be fixed, for example, face-down to the mounting substrate 41.

Figure 7:
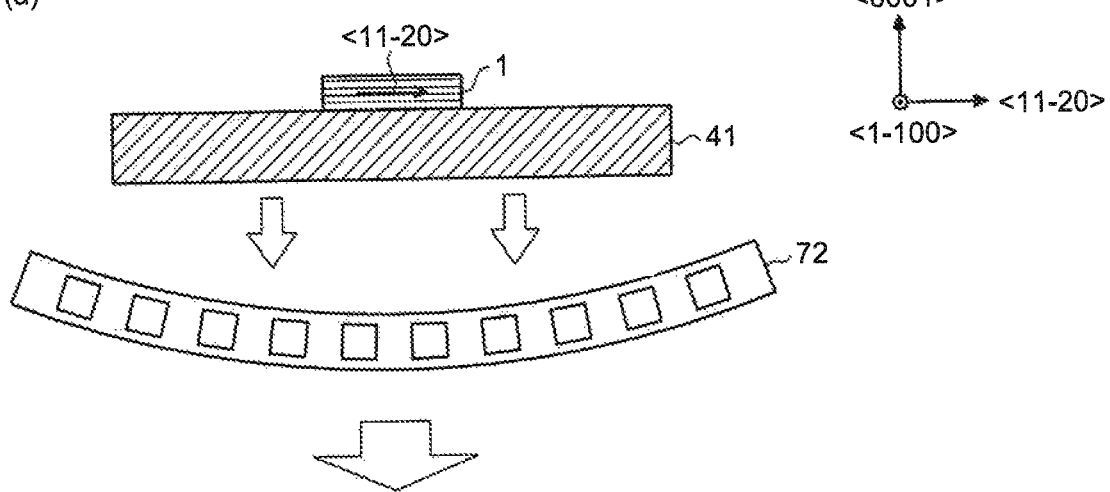
FIG. 7 is a schematic sectional drawing that illustrates a modification of the method of manufacturing a semiconductor device according to the second embodiment and the mounting state.
Figure 7:
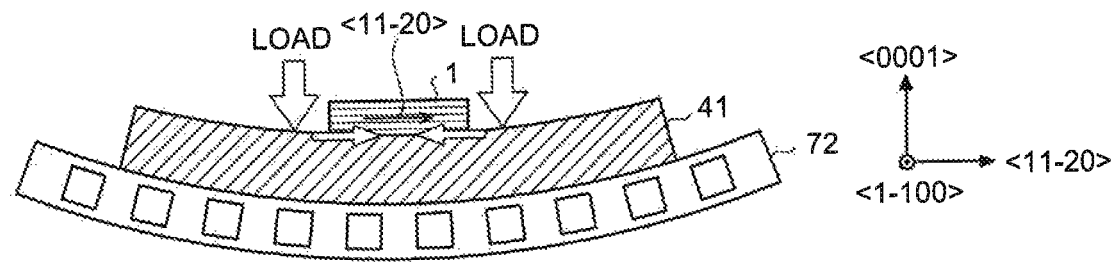

In the above description, the protrusions 63 formed on the support substrate 61 are used for concavely curving the mounting substrate 41; however, the embodiment is not limited to this configuration. As another example, the mounting substrate 41 may be fixed to a support substrate 72 having a concavely curved adhering surface as illustrated in FIG. 7(*a*) in a manner closely attaching the mounting substrate 41 to the adhering surface as illustrated in FIG. 7(*b*). FIG. 7 is a schematic sectional drawing that illustrates a modification of the method of manufacturing a semiconductor device according to the second embodiment and the mounting state.

With the above-described configuration according to this embodiment, as with the first embodiment, compressive stress in the <11-20> direction is continuously applied to the semiconductor chip 1 in the mounted state. This compressive stress changes the current-voltage characteristics of the SiC substrate 11 and reduces on-resistance in the <1-100> direction and, furthermore, reduces resistance of the channel CH formed under the gate electrode 17, which can improve performance characteristics of the semiconductor element 10.

Other configurations, operation, and effects are the same as those of the earlier-described embodiment, and detailed description will be therefore omitted.

Third Embodiment

Figure 8:
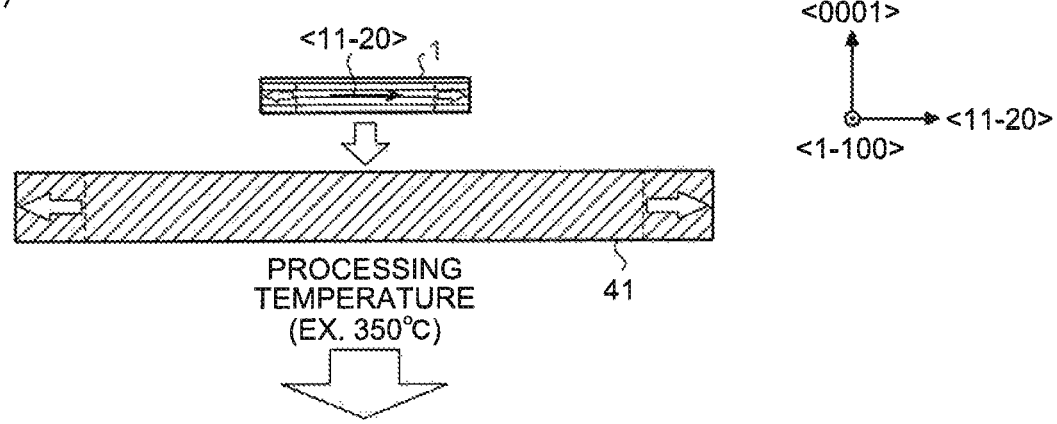
FIG. 8 is a schematic sectional drawing that illustrates a method of manufacturing a semiconductor device according to a third embodiment and a mounting state.
Figure 8:
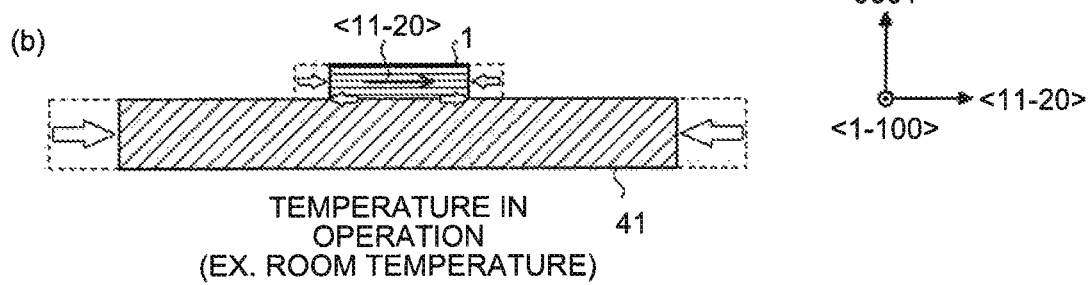

In the configurations of the first and the second embodiments, compressive stress in the <11-20> direction is continuously applied to the semiconductor chip 1 in the ordinary state by applying mechanical load to the mounting substrate 41 having the semiconductor chip 1 mounted thereon and bending the mounting substrate 41; however, the embodiment is not limited to this configuration. For example, as illustrated in FIG. 8, such a configuration is also applicable that uses the mounting substrate 41 having a linear expansion coefficient different from that of the SiC substrate 11 and mounts the semiconductor chip 1 on the mounting substrate 41 at a processing temperature different from a temperature of the semiconductor chip 1 in the ordinary state (for example, in operation and when unused). This configuration allows compressive stress in the <11-20> direction to be continuously applied to the semiconductor chip 1 in the mounted state.

FIG. 8 is a schematic sectional drawing that illustrates a method of manufacturing a semiconductor device according to a third embodiment and a mounting state and further illustrate an exemplary configuration where compressive stress in the <11-20> direction is continuously applied to the semiconductor device by mounting the semiconductor device on a mounting substrate having a linear expansion coefficient larger than that of the SiC substrate. In the example of FIG. 8(*a*), the semiconductor chip 1 is fixed to the mounting substrate 41 having a larger linear expansion coefficient than the linear expansion coefficient in the <11-20> direction of the SiC substrate 11. The semiconductor chip 1 may be fixed face-up or face-down to the mounting substrate 41. The processing temperature when fixed is higher (for example, 350° C.) than the temperature (for example, a room temperature) in ordinary operation.

The mounting substrate 41 and the semiconductor chip 1 in the ordinary state have lower temperatures (such as a room temperature) than the processing temperature when they are fixed to each other. As illustrated in FIG. 8(*b*), the mounting substrate 41 having a larger linear expansion coefficient therefore shrinks to a larger extent than the semiconductor chip 1 having a smaller linear expansion coefficient, compared to when fixed. In the ordinary state, compressive stress along the <11-20> direction is therefore continuously applied to the semiconductor chip 1 based on a difference in the amount of shrink per unit length between the mounting substrate 41 and the SiC substrate 11.

Because the linear expansion coefficient of the SiC substrate 11 is approximately 4 to 4.5 ($\times 10^{-6}$/K), various conductive materials, insulating materials, semiconductor materials, and the like having, for example, a linear expansion coefficient larger than approximately $4.5 \times 10^{-6}$/K can be used for the material of the mounting substrate 41.

With the above-described configuration according to this embodiment, as with the first embodiment and the second embodiment, compressive stress in the <11-20> direction is continuously applied to the semiconductor chip 1 in the mounted state. This compressive stress changes the current-voltage characteristics of the SiC substrate 11 and reduces on-resistance in the <1-100> direction and, furthermore, reduces resistance of the channel CH formed under the gate electrode 17, which can improve performance characteristics of the semiconductor element 10.

Other configurations, operation, and effects are the same as those of the earlier-described embodiments, and detailed description will be therefore omitted.

Fourth Embodiment

A semiconductor device and a method of manufacturing the same according to a fourth embodiment will now be described in detail with reference to the accompanying drawings. FIG. 9A and FIG. 9B are drawings that illustrate an exemplary mounting structure of a semiconductor device according to this embodiment. Specifically, FIG. 9A is a top view, and FIG. 9B is a side view in the <1100> direction of the semiconductor device.

As illustrated in FIG. 9A and FIG. 9B, in the semiconductor device according to this embodiment, the semiconductor chip 1 is mounted on a mounting substrate 81 in a manner sandwiched between pressing members 83 fixed to the mounting substrate 81. The mounting substrate 81 may have a narrow portion 82 at a location where the semiconductor chip 1 is mounted. The pressing members 83 holding the semiconductor chip 1 are fixed to the mounting substrate 81, for example, in joint areas 83*a* arranged opposite to sides contacting the semiconductor chip 1. In this state, an end on the side contacting the semiconductor chip 1 of the pressing member 83 is released and is movable with expansion and shrink of the pressing member 83.

A material such as a ceramic having a larger linear expansion coefficient than that of the mounting substrate 81 is used for the pressing member 83. Use of such a material allows compressive force to be applied to the semiconductor chip 1 when the temperature around the semiconductor chip 1 is increased due to heat generated with the semiconductor chip 1 operating and an increase in the temperature of the external environment. This configuration can generate compressive stress in the <11-20> direction on the semiconductor chip 1 in operation by aligning the <11-20> direction of crystal orientation of the SiC substrate 11 of the semiconductor chip 1 with a direction in which the semiconductor chip 1 is sandwiched by two pressing members 83.

In the example of FIG. 9A and FIG. 9B, the semiconductor chip 1 may be mounted face-up or face-down on the mounting substrate 81.

With the above-described configuration according to this embodiment, as with the earlier-described embodiments, compressive stress in the <11-20> direction is continuously applied to the semiconductor chip 1 in operation. This compressive stress changes the current-voltage characteristics of the SiC substrate 11 and reduces on-resistance in the <1-100> direction and, furthermore, reduces resistance of the channel CH formed under the gate electrode 17, which can improve performance characteristics of the semiconductor element 10.

Other configurations, operation, and effects are the same as those of the earlier-described embodiments, and detailed description will be therefore omitted.

Fifth Embodiment

Figure 10A:
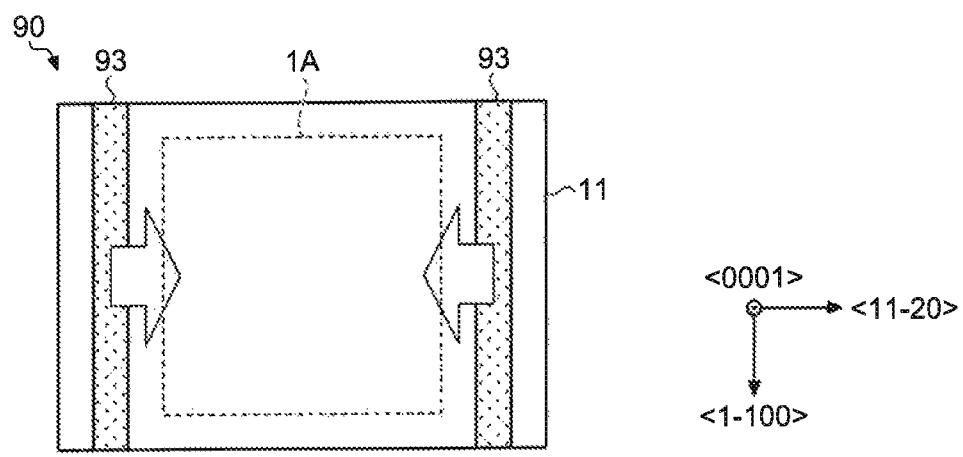
FIGS. 10A and 10B are drawings that illustrate an exemplary schematic configuration of a semiconductor device according to a fifth embodiment.
Figure 10B:
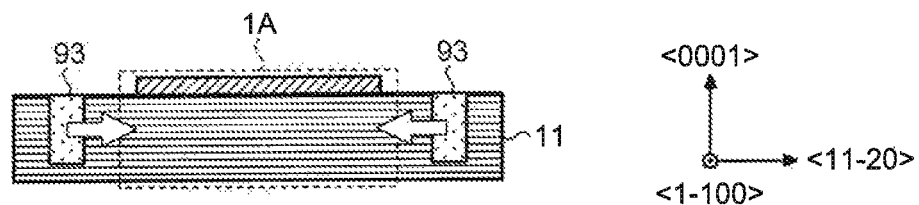

A semiconductor device and a method of manufacturing the same according to a fifth embodiment will now be described in detail with reference to the accompanying drawings. FIG. 10A and FIG. 10B are drawings that illustrate an exemplary schematic configuration of a semiconductor device according to this embodiment. Specifically, FIG. 10A is a top view of the semiconductor device, and FIG. 10B is a sectional drawing of the semiconductor device along the (1-100) plane.

As illustrated in FIG. 10A and FIG. 10B, a semiconductor device 90 according to this embodiment includes two spread regions 93, which are different from an element forming region 1A and to which impurities are injected, at locations sandwiching the element forming region 1A on the SiC substrate 11. The element forming region 1A is provided with one or a plurality of semiconductor elements 10 exemplarily illustrated in FIG. 1 and FIG. 2. Such impurities may be injected to the spread region 93 that allow the spread region 93 to have a larger linear expansion coefficient than the linear expansion coefficient of the SiC substrate 11.

In this manner, formation of spread regions 93 having a larger linear expansion coefficient than that of the SiC substrate 11 at locations to sandwich the element forming region 1A generates force in a direction of compressing the element forming region 1A when the temperature around the element forming region 1A is increased due to heat generated with the semiconductor device 90 operating and an increase in the temperature of the external environment. Formation of two spread regions (expansion units) 93 at locations to sandwich the element forming region 1A in the <11-20> direction of crystal orientation of the SiC substrate 11 thus can generate compressive stress in the <11-20> direction on the element forming region 1A in operation. As with other embodiments, this compressive stress changes the current-voltage characteristics of the SiC substrate 11 and reduces on-resistance in the <1-100> direction and, furthermore, reduces resistance of the channel CH formed under the gate electrode 17. The performance characteristics of the semiconductor element 10 are therefore improved.

Figure 11A:
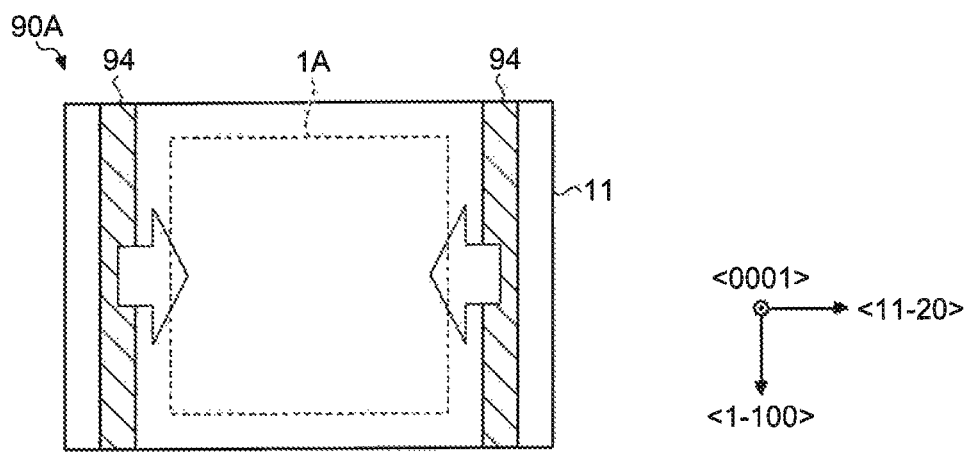
FIG. 11A and FIG. 11B are drawings that illustrate an exemplary schematic configuration of a semiconductor device according to a modification of the fifth embodiment.
Figure 11B:
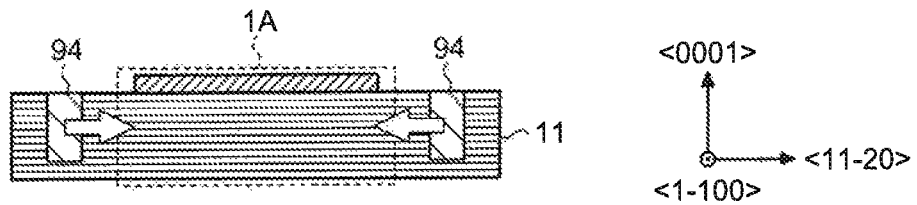

In the above-described exemplary configuration, impurities are injected to the SiC substrate 11, whereby spread regions 93 having a linear expansion coefficient different from that of the SiC substrate 11 are formed; however, this embodiment is not limited to this configuration. For example, as a semiconductor device 90A of FIG. 11A and FIG. 11B indicates, such a configuration may be applicable that forms trenches on the SiC substrate 11 instead of forming the spread regions 93 and embeds rigid embedded members (expansion units) 94 having a linear expansion coefficient different from that of the SiC substrate 11 in the trenches. As with the configuration of forming the spread regions 93, this configuration is also capable of generating compressive stress in a certain direction on the element forming region 1A in operation. As with other embodiments, this compressive stress changes the current-voltage characteristics of the SiC substrate 11 and reduces on-resistance in the <1-100> direction and, furthermore, reduces resistance of the channel CH formed under the gate electrode 17. The performance characteristics of the semiconductor element 10 are therefore improved. FIG. 11A is a top view of the semiconductor device 90A, and FIG. 11B is a sectional drawing along the (1-100) plane of the semiconductor device 90A.

Other configurations, operation, and effects are the same as those of the earlier-described embodiments, and detailed description will be therefore omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor chip that has an element structure including:
      a silicon carbide substrate that has a hexagonal crystal structure and is made of silicon carbide different from silicon;
      a gate electrode that is disposed on a part above a first surface corresponding to a (0001) plane or a (000-1) plane of the silicon carbide substrate;
      an insulating film that is interposed between the silicon carbide substrate and the gate electrode; and
      a source and a drain that are disposed with respect to the silicon carbide substrate and the gate electrode such that at least a part of a channel through which a carrier moves extends in a<1-100>direction of crystal orientation of the silicon carbide substrate; and
   a mounting substrate that is fixed with the semiconductor chip such that compressive stress in a<11-20>direction of crystal orientation of the silicon carbide substrate is applied to the semiconductor chip at least in operation.

2. The semiconductor device according to claim 1, wherein the compressive stress in the <11-20>direction is applied to the semiconductor chip by using mechanical resilience of the mounting substrate.

3. The semiconductor device according to claim 1, wherein the mounting substrate applies the compressive stress in the <11-20>direction to the semiconductor chip with a surface to which the semiconductor chip is fixed curved in a manner of shrinking in the <11-20>direction.

4. The semiconductor device according to claim 1, wherein
   a linear expansion coefficient of the mounting substrate is larger than a linear expansion coefficient of the silicon carbide substrate, and
   the compressive stress in the <11-20>direction is applied to the semiconductor chip using a difference in the linear expansion coefficient between the mounting substrate and the silicon carbide substrate.

5. The semiconductor device according to claim 1, further comprising:
- a pressing member that is disposed at a location to sandwich the semiconductor chip fixed to the mounting substrate in the <11-20>direction of the silicon carbide substrate, wherein
- a linear expansion coefficient of the pressing member is larger than the linear expansion coefficient of the silicon carbide substrate.

6. The semiconductor device according to claim 1, wherein the silicon carbide substrate partially includes a silicon carbide film.

7. The semiconductor device according to claim 1, wherein
- at least a part of the source contacts the first surface of the silicon carbide substrate,
- the gate electrode is located above a region that is on the first surface of the silicon carbide substrate and is different from a region in which the source contacts the first surface,
- the insulating film is interposed between the gate electrode and the source as well as between the silicon carbide substrate and the gate electrode, and
- the drain is located on a second surface opposite to the first surface of the silicon carbide substrate and on a side opposite to the gate electrode with the silicon carbide substrate interposed.

8. The semiconductor device according to claim 1, wherein each of the source and the drain is located in one of regions that are on the first surface of the silicon carbide substrate and that sandwich a region under the gate electrode.

9. A method of manufacturing a semiconductor device, the method comprising:
- forming, on a silicon carbide substrate having a hexagonal crystal structure and made of silicon carbide different from silicon, a semiconductor element with an element structure including a gate electrode that is disposed on a part above a first surface corresponding to a (0001) plane or a (000-1) plane of the silicon carbide substrate; an insulating film that is interposed between the silicon carbide substrate and the gate electrode; and a source and a drain that are disposed with respect to the silicon carbide substrate and the gate electrode such that at least a part of a channel through which a carrier moves extends in a<1-100>direction of crystal orientation of the silicon carbide substrate; and
- fixing the silicon carbide substrate to a mounting substrate such that compressive stress in a<11-20>direction of crystal orientation of the silicon carbide substrate is applied.

10. The semiconductor device according to claim 1, wherein a mounting surface of the mounting device is flat, the semiconductor chip being fixed to the mounting surface, the compressive stress being applied in a state where the mounting surface is flat.

11. The method according to claim 9, wherein a device mounting surface of the mounting substrate is bent by applying mechanical load to the mounting substrate, the silicon carbide substrate is fixed on the bent device mounting surface, and the mechanical load is released so that the compressive stress is applied to the silicon carbide substrate.

* * * * *